United States Patent [19]
Guckel et al.

[11] Patent Number: 5,188,983
[45] Date of Patent: Feb. 23, 1993

[54] POLYSILICON RESONATING BEAM TRANSDUCERS AND METHOD OF PRODUCING THE SAME

[75] Inventors: Henry Guckel, Madison; Jeffry Sniegowski, Oregon, both of Wis.

[73] Assignee: Wisconsin Alumni Research Foundation, Madison, Wis.

[21] Appl. No.: 816,972

[22] Filed: Jan. 3, 1992

Related U.S. Application Data

[62] Division of Ser. No. 508,001, Apr. 11, 1990, Pat. No. 5,090,254.

[51] Int. Cl.$^5$ ............................................. H01L 21/60
[52] U.S. Cl. ..................................... 437/209; 437/213; 437/215; 73/862.59
[58] Field of Search .......................... 437/209, 215, 219; 73/862.59

[56] References Cited

U.S. PATENT DOCUMENTS

| | | |
|---|---|---|
| 4,567,451 | 1/1986 | Greenwood . |
| 4,744,863 | 5/1988 | Guckel et al. . |
| 4,772,786 | 9/1988 | Guckel et al. . |
| 4,805,456 | 2/1989 | Howe et al. . |
| 4,841,775 | 6/1989 | Ikeda et al. . |
| 4,853,669 | 8/1989 | Guckel et al. . |
| 4,897,360 | 1/1990 | Guckel et al. . |
| 4,901,570 | 2/1990 | Chang et al. . |
| 5,013,693 | 5/1991 | Guckel et al. . |

FOREIGN PATENT DOCUMENTS

| | | |
|---|---|---|
| 0244086 | 11/1987 | . |
| 0244087 | 11/1987 | . |
| 0266974 | 5/1988 | European Pat. Off. . |
| 0279515 | 8/1988 | . |
| WO8606548 | 11/1986 | PCT Int'l Appl. . |
| 2180691A | 4/1987 | United Kingdom . |

OTHER PUBLICATIONS

K. E. B. Thornton, et al., "Optically Excited Micromechanical Resonator Pressure Sensor", Optical Fiber Sensors 1988 Technical Digest Series, vol. 2, Part 2, New Orleans, La., Jan. 1988, pp. 433–436.
K. Ikeda, et al., "Silicon Pressure Sensor with Resonant Strain Gages Built into Diaphragm", Technical Digest of the 7th Sensor Symposium, Shigaki Kaikan, Tokyo Japan, 30–31 May 1988, pp. 55–58.
K. Ikeda, et al., "Three Dimensional Micromachining of Silicon Resonant Stain Gage", Technical Digest of
(List continued on next page.)

Primary Examiner—Brian E. Hearn
Assistant Examiner—Kevin M. Picardat
Attorney, Agent, or Firm—Foley & Lardner

[57] ABSTRACT

Force transducers are formed of a beam of polysilicon which is mounted at its ends to a silicon substrate and is encapsulated within a polysilicon shell which defines, with the substrate, a cavity around the resonating beam. The cavity is sealed off from the atmosphere and evacuated to maximize the Q of the resonating beam. The beam is produced by deposition of polysilicon in such a way that, combined with subsequent annealing steps, the beam is in zero or low tensile strain. Resonant excitation of the beam may be accomplished in various ways, including capacitive excitation, and the vibratory motion of the beam may be detected utilizing an implanted resistor which is piezoresistive. Formation of the beam is carried out by depositing the beam on a sacrificial layer and surrounding it in a second sacrificial layer before the encapsulating polysilicon shell is formed. The sacrificial layers are etched out with liquid etchant which passes through channels in the periphery of the shell. Following etching, the interior of the cavity surrounding the beam is maintained in a wash liquid so that the beam is not deflected toward any of the adjacent surfaces, and the wash liquid is removed by freezing and sublimation. The interior surfaces of the cavity and the outer surfaces of the beam are passivated and the channels leading into the cavity may be sealed by oxidation in an oxidizing atmosphere, which also results in consumption of oxygen within the cavity.

6 Claims, 9 Drawing Sheets

OTHER PUBLICATIONS the 7th Sensor Symposium, Shigaki Kaikan, Japan, 30–31 May 1988, pp. 193–196.

K. Ikeda, et al., "Study of Nonlinear Vibration of Si Resonant Beam Strain Gage", Technical Digest of the 8th Sensor Symposium, 1989, Tokyo, Japan, pp. 12–24.

H. Guckel, J. Sniegowski, T. Christenson, "Advances in Processing Techniques for Silicon Micromechanical Devices with Smooth Surfaces", Proceedings IEEE Micro Electro Mechanical Systems, Salt Lake City, Utah, Feb. 20–22, 1989, pp. 71–75.

H. Guckel, J. Sniegowshi, T. Christenson, F. Raissi, "The Application of Fine Grain, Tensile Polysilicon to Mechanically Resonant Transducers", copy of a paper relating to an oral presentation made by T. Christenson at Transducers '89, the 5th International Conference on Solid State Sensors and Actuators & Euro-sensors III, Jun. 25–30, 1989, in Montreux, Switzerland.

H. Guckel, J. Sniegowski, T. Christenson, "Construction and Performance Characteristics of Polysilicon Resonating Beam Force Transducers", a paper representing the content of a talk presented by H. Guckel at the Toyota Conference, Oct. 22–25, 1989 in Japan.

H. Guckel, J. Sniegowski, T. Christenson, S. Mohney, T. Kelly, "Fabrication of Micromechanical Devices from Polysilicon Films with Smooth Surfaces", Sensors and Actuators, vol. 20, Nov. 15, 1989, pp. 117–122.

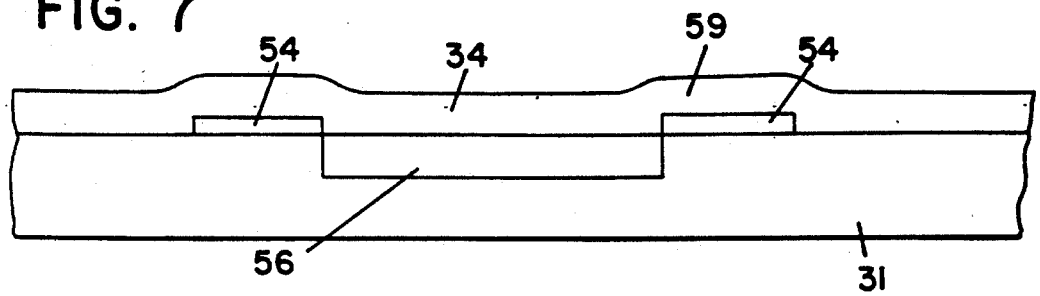
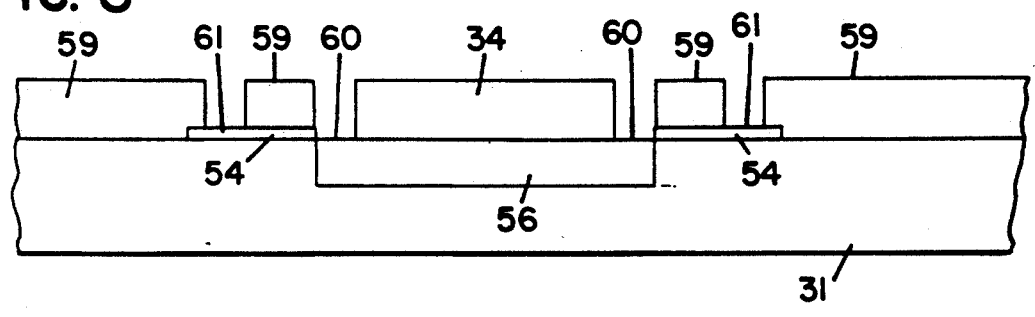
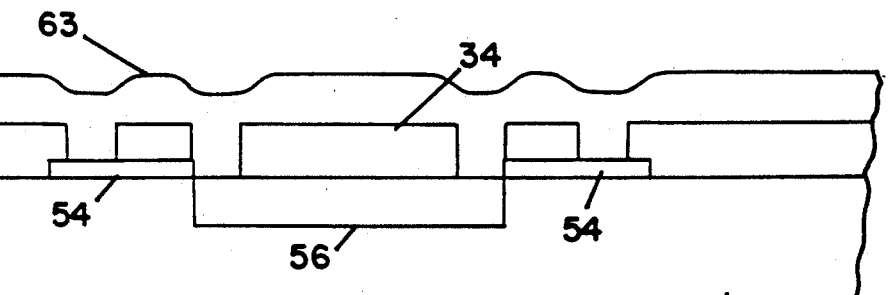
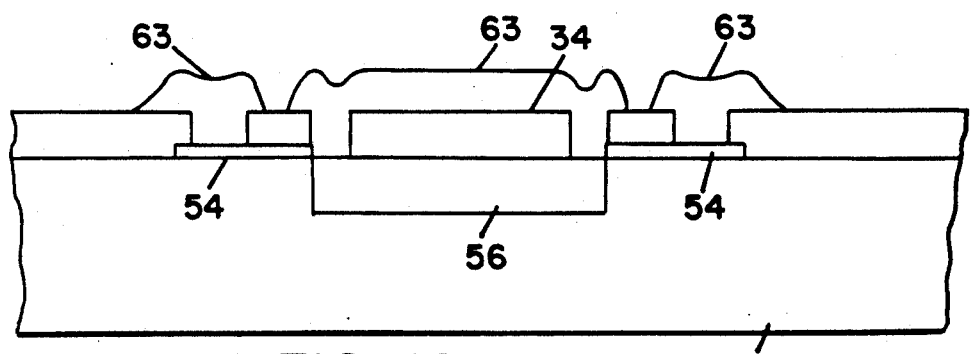

POLYSILICON RESONATING BEAM TRANSDUCERS AND METHOD OF PRODUCING THE SAME

This invention was made with United States government support awarded by the National Science Foundation (NSF), Grant # EET-88-15285. The United States Government has certain rights in this invention.

This is a division of Ser. No. 07/508,001 filed on Apr. 11, 1990, now U.S. Pat. No. 5,090,254.

FIELD OF THE INVENTION

This invention pertains generally to the field of semiconductor and micromechanical devices and processing techniques therefor, and particularly to microminiature force transducers of the type that may be utilized for measurement of pressure, strain, displacement and the like.

BACKGROUND OF THE INVENTION

Many available transducers, especially microminiaturized transducers, use piezoresistive deformation sensing. Piezoresistive sensing is very effective because it is nearly insensitive to lay-out dependent parasitics, which is not the case with capacitive sensing, and because resistive sensing provides linear output signals which can be temperature compensated. The primary Problems for piezoresistive sensing are in data extraction. The change in resistance over the deformation span of a pressure transducer is typically 1% or so, which means that precision DC-amplifiers are required, and major problems can occur due to device imperfections which would not be as troublesome if the output signals were larger Mechanically resonant structures have been utilized as force transducers. In such transducers, the applied force causes a change in the resonant frequency of the resonating structure, e.g., a resonating wire or beam. Resonating transducers have been demonstrated which have a change of frequency of more than 100% caused by forces which are much smaller than those which will cause a 1% change in the resistance of a piezoresistive sensor. The transduction sensitivity for resonating transducers is therefore much higher than for piezoresistive transducers. Because resonant transducers use data extraction circuitry which measures frequency or time, the amplitude of the signal from the transducer is not crucial. In addition, because frequency or time is being measured, the output of the transducer is easily converted to a digital output signal, which is well adapted for use by digital processing systems.

Although mechanically resonant transducers are typically very expensive, their expense is balanced against the advantages mentioned above, as well as their extreme accuracy and insensitivity to temperature. However, because such resonating structures are highly sensitive to forces, even small temperature changes can affect performance in packaging structures for the resonator which are formed from thermally mismatched materials. A well designed resonating transducer will avoid such thermal mismatch by utilizing a single material for the resonator and the mechanical structure with which it is incorporated. The cost of such transducers can be minimized if they can be made by bulk manufacturing techniques.

An all silicon resonating beam transducer has recently been developed by Yokogawa Electric Corporation. See K. Ikeda, et al., "Silicon Pressure Sensor with Resonant Strain Gauges Built Into Diaphragm," Technical Digest of the 7th Sensor Symposium, Shigaku Kaikan, Tokyo, Japan, 30–31 May 1988, pp. 58–58, and K. Ikeda, et al., "Three-Dimensional Micromachining of Silicon Resonant Strain Gauge," id., pp 193–196. A related device is shown in U. K. Published Patent Application GB 2,180,391A, Application No. 8620782, published Apr. 1, 1987, entitled "Vibratory Transducer and Method of Making the Same". The Yokogawa device is manufactured by using selective epitaxy and preferential chemical etches. The device is made from silicon with several different doping levels. The resonator is an H-type flexure resonator with four clamped supports at the end points of the H. Because the manufacturing process uses a P++ etch stop (heavily boron doped silicon which does not etch in, for example, hydrazine) the conductivity of the H resonator is very large. The high conductivity of the resonator makes an H structure preferable to a simple beam, and may reduce the available choices for sensing and electronic excitation. The foregoing papers report excitation of the resonator utilizing a magnetic bias field supplied by a permanent magnet along the plane of the wafer, with current forced through one of the beams of the H. This results in a vertical force. The second beam of the H is slaved to the motion of the driven beam of the H via the interior or joining beam of the H. An output voltage, which is magnetically induced, is sensed on the second beam. This output signal is amplified and fed back to the driven beam to maintain the oscillation at resonance. The fundamental mode resonant frequency for the device is on the order of magnitude of 50 kilohertz (50 KHz) or less. The strain field in the beam material ordinarily will be highly tensile in such structures and any process variations may cause such devices to exhibit variations in resonant frequency. The heavily doped silicon ordinarily exhibits a large amount of mechanical slip, which can affect the strength and long term stability of the resonator.

SUMMARY OF THE INVENTION

In accordance with the present invention, a resonating beam force transducer is formed of a beam of polycrystalline silicon (polysilicon) which is mounted at one or both ends to a silicon substrate and which is encapsulated within an outer shell preferably formed of polysilicon. The space within the shell surrounding the resonating beam is preferably substantially evacuated to maximize the mechanical Q obtainable from the resonant structure. Because the structure can be formed of substantially compatible or identical materials —— single crystal silicon and polysilicon —— temperature dependent mismatches in the materials of the structure are essentially avoided. The beam itself can be excited in various ways, such as by capacitive excitation utilizing a conductive electrode formed on a portion of the beam and a corresponding spaced secondary electrode acting as the other plate of the capacitor, with measurement of the beam motion preferably accomplished using a piezoresistive device formed on the beam. The resonating beam may be formed in any manner, for example, as a cantilever beam, a simple straight beam clamped at both ends, or an H-type beam in which two straight resonating beam members are joined by a bridge member. Other beam structures such as rods and hollow tubes may also be used.

Resonating beam transducers of the present invention are preferably formed utilizing semiconductor processing techniques which are consistent with the formation of microelectronic structures on the substrate. A preferred method for the formation of the transducers involves the formation of a sacrificial layer on the substrate, the formation of a polysilicon beam onto the sacrificial layer in a manner which, when combined with proper subsequent annealing steps, produces a beam that is in a desired state of strain, —— preferably zero strain or low tensile strain ——, the surrounding of the beam with a further sacrificial layer, the formation of a polysilicon shell surrounding the outer sacrificial layer and the beam within, and subsequent etching and sealing steps.

The outer polysilicon shell is preferably formed over peripheral sacrificial layer structures which, when etched, will define etch channels through which the etchant can reach the sacrificial layers within the outer shell. The etching step removes all of the sacrificial layer material around the beam to leave the beam free. Removal of the liquid etchant or a subsequent wash solution within the cavity surrounding the beam may be accomplished by first freezing the liquid and then sublimating the frozen liquid to prevent the beam from being drawn into contact with any adjacent surface. By avoiding such contact, problems of contact adhesion commonly encountered in forming microelectronic beam structures can be avoided. The internal surfaces of the cavity and the external surfaces of the beam are then passivated so than any subsequent contact between these structures will not result in bonding, and the etched channels are sealed utilizing a reactive sealing step which further results in reaction of the atmosphere (e.g., an oxygen atmosphere) within the cavity to reduce the pressure, i.e., to produce a "vacuum" within the cavity surrounding the beam. Such processing yields a free polysilicon beam which is substantially free of dopants, thus allowing the built-in strain on the beam to be controlled (or reduced to zero) by annealing steps. The lack of dopants in the bulk of the beam also allows devices to be readily formed on the beam surface in desired patterns.

The completed device can be utilized to measure strain directly in the substrate, and the substrate itself can be adhered to a larger structure to allow measurements of the strain in the larger structure. Similarly, the substrate itself may form a cantilever beam, such that the resonating beam transducer will measure deflections of the substrate beam. The substrate beam may itself form a diaphragm of a pressure sensor, with the resonating beam transducer measuring the strain in the substrate diaphragm and therefore the relative deflection caused by the pressure differential across the diaphragm.

The resonating beam transducers of the present invention are particularly suited for construction in very small sizes, compatible with microcircuitry: for example, transducers may be formed with resonating beams having lengths in the range of a few hundred microns, widths in the tens of microns, and thicknesses of a few microns. Such resonating beams, when encapsulated in a vaccum cavity, display fundamental mode resonances in the hundreds of kilohertz (kHz) range with very high Q.

Further objects, features, and advantages of the invention will be apparent from the following detailed description when taken in conjunction with the accompanying drawings.

BRIEF DESCRIPTION OF THE DRAWINGS

In the drawings:

FIGS. 3-14 are cross-sectional views through a substrate illustrating the sequential processing steps in the formation of a resonating beam transducer of the present invention.

DESCRIPTION OF THE PREFERRED EMBODIMENTS

Figure 1:
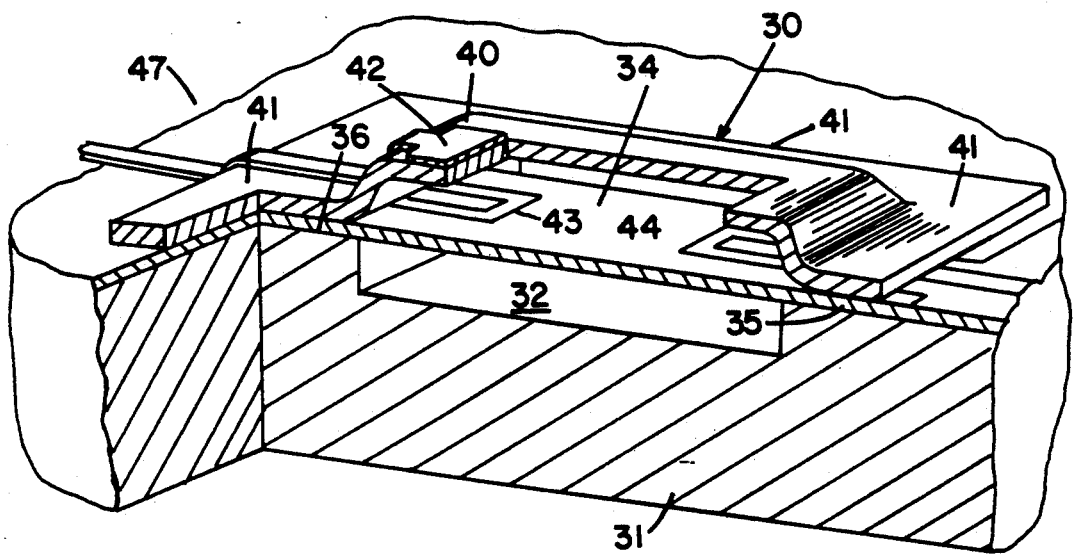
FIG. 1 is a perspective cross-sectional view of the resonating beam force transducer of the invention, with portions thereof broken away for clarity of illustration.
Figure 24:
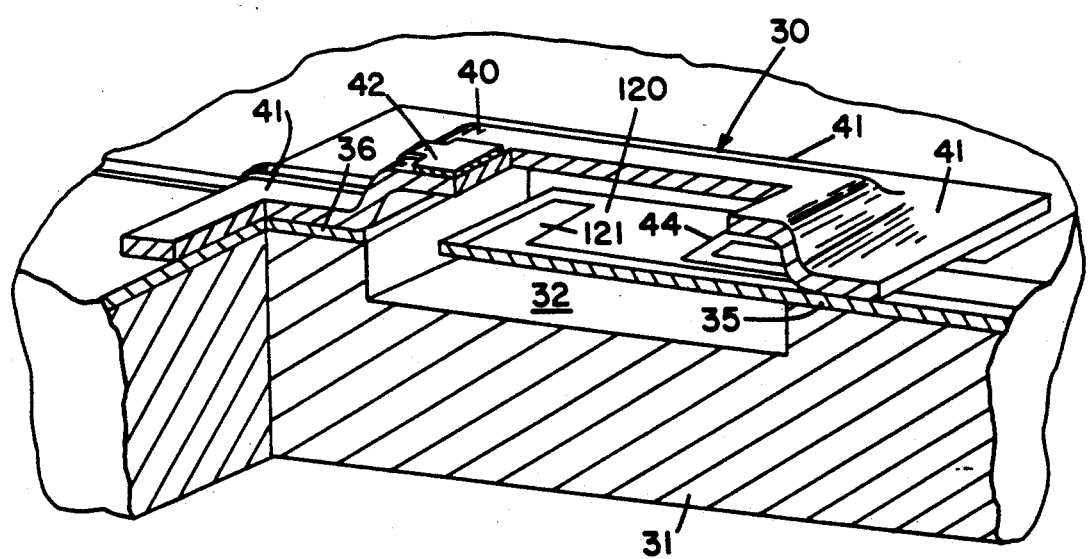
FIG. 24 is a perspective partial cross-sectional view of a resonating beam transducer similar to that of FIG. 1 but formed with a cantilever beam.

With reference to the drawings, a plan view of a resonating beam force transducer formed on a silicon substrate is shown generally at 30 in a cross-sectional perspective view in FIG. 1, with the parts being shown in somewhat simplified form for convenience of illustration. The force transducer 30 includes a substrate 31 which may be formed of single crystal silicon, in which a well or bottom cavity 32 is formed. Extending over the cavity 32 is a resonating beam 34 which may be formed of polysilicon in the manner described below. The beam 34 extends across the well 32 and is firmly mounted and secured to the substrate at its ends 35 and 36. The attachment of the beam 34 at its ends to the substrate 31 allows strains in the substrate in the direction of the length of the beam to be applied as forces to the beam which, as discussed further below, result in a change in the resonant frequency of the beam. However, the beam may also be attached at only one end, as shown in FIG. 24, to provide a cantilever resonating beam which can be used, for example, as an accelerometer. An encapsulating shell 40 of polysilicon is formed over the resonating beam 34 and spaced away therefrom to define, with the well 32 of the substrate, a cavity which completely surrounds the beam 34. The polysilicon shell layer 40 extends to peripheral edges 41 which rest upon and seal against the surface of the underlying polysilicon layer, which also defines the resonating beam 34, and thereby seals off the interior of the cavity from the surrounding atmosphere.

As explained further below, the cavity is preferably evacuated to minimize atmospheric damping of the vibrations of the beam 34. The surface of one of the ends of the beam 34 has a dopant (e.g., boron) implanted therein in a pattern 43 to define a conductive electrode on the surface of the beam and form one plate of a capacitor. The other plate of the capacitor may be formed by the substrate material 31 at the bottom of the cavity 32 if the substrate 31 has a dopant diffused therein to render it conductive. Alternatively, the polysilicon shell layer 40 above the conductor 43 may have a dopant diffused therein to render it conductive to form the other plate of the capacitor, or a metal (e.g., aluminum) pad 42 as shown in FIG. 1 may be deposited on the shell to form the other conductive plate. A second conductor 44 is formed on the other end of the resonating beam by. implanting a dopant, such as boron, into the surface of the beam and is used for generating a signal indicative of the vibrations of the beam. The conductor 44 which functions as a resis will change resistance with strain in the beam, in accordance with the piezoresistive effect, allowing the vibration of the beam 34 to be monitored in a simple manner. The conductive plate 43 may also be formed at other locations on the beam, such as the center of the beam, which may be selected to give the optimum excitation of the beam.

Figure 2:
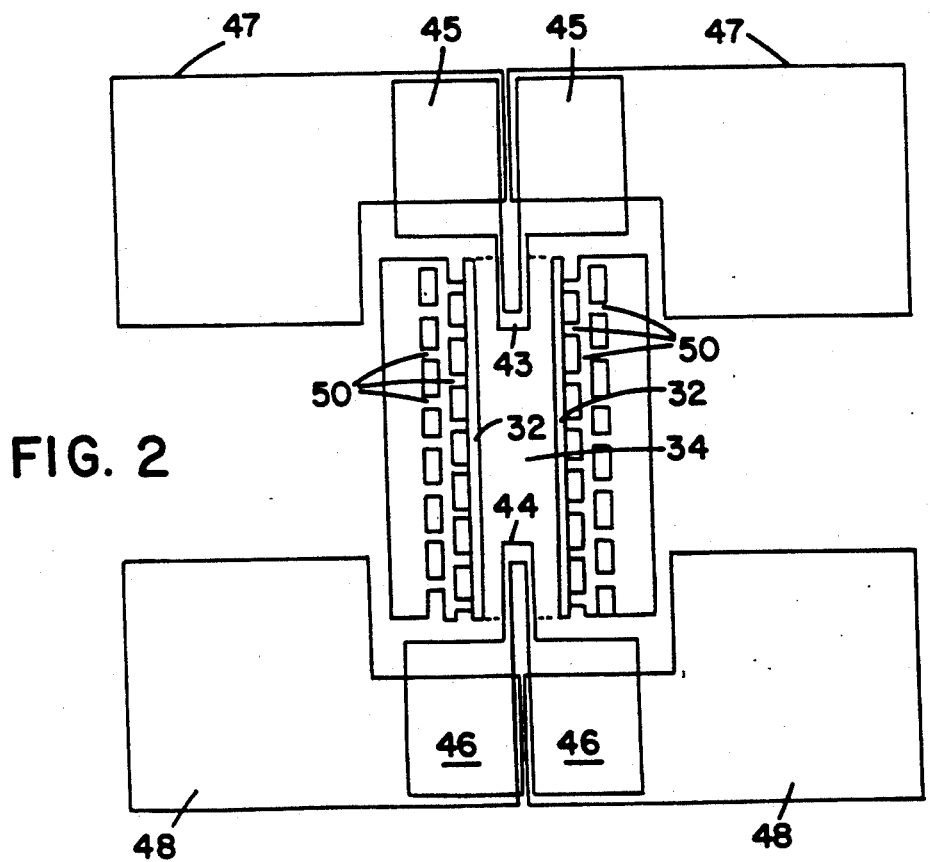
FIG. 2 is a plan view of the resonating beam transducer of FIG. 1 formed on a substrate.
Figure 3:
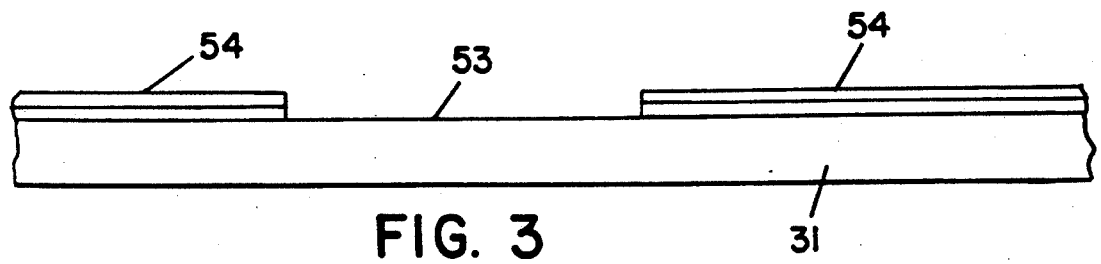
Figure 4:
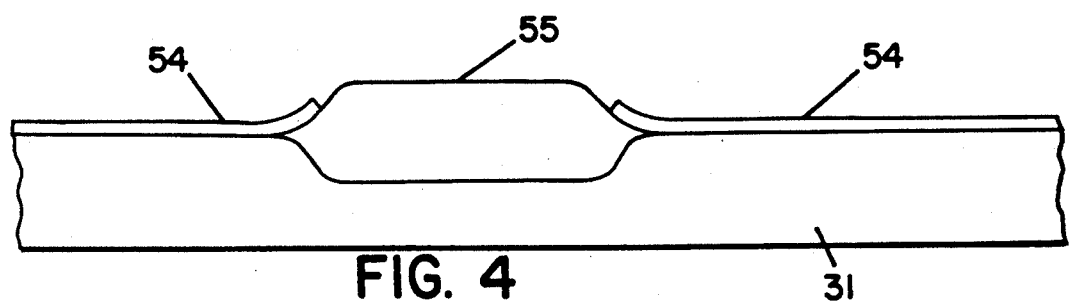

As best shown in the top plan view of FIG. 2, the dopant pattern forming the conductor 43 and 44 extends to pad areas 45 and 46, respectively, at positions off the beam 34. The pads areas 45 and 46 may have larger electrical conductive pads formed by deposition of a metal over them, such as the metal pads 47 and 48 illustrated in FIG. 2 which cover and are in electrical contact with pads 45. The metal pads 47 and 48 can serve as electrical connection points to which lead wires can be connected. The resonant beam force transducer is shown in FIG. 2 with the covering polysilicon shell 40 removed to illustrate the resonant beam structure. Also illustrated in FIG. 2 are the etchant channels 50 by which the etchant reaches the sacrificial material surrounding the beam 34 to etch away the sacrificial layers and free the beam, as explained further below. These etchant channels are filled and sealed to seal the cavity, as also described further below.

The substrate 31 may be part of a silicon diaphragm in a pressure sensor, with the resonating beam force transducer 30 being utilized to measure strain in the substrate diaphragm, and thus the pressure causing deflection of the diaphragm. The substrate 31 may also be utilized as a strain transducer by gluing or otherwise tightly affixing it to a larger structure which is undergoing strain. The strain of the underlying structure is transmitted to the substrate 31 and thence to the resonating beam 34 to thereby affect the resonant frequency of the beam.

The transducer structure 30 may be made quite small, and is formed in a way which is compatible with microelectronic circuit processing techniques. For example, the beam 34 may have a length in the range of a few hundred microns, e.g., 200 microns, with the width being in the range of a few tens of microns and thickness of the beam 34 in the range of a few microns, e.g., 1-2 microns.

The formation of the polysilicon films defining the beam 34 is particularly critical, since the beam should have good mechanical integrity, stability, uniformity, strength, and freedom from defects. In addition, the beam should be in a controlled state of strain, preferably zero strain or a low level of tensile strain (e.g., less than about 0.4%). It is also preferable that the bulk of the beam be substantially undoped so as not to interfere with formation of devices on the beam and not to introduce the high strain fields normally encountered with heavy doping. Such polysilicon films can be achieved by carefully controlled deposit of polysilicon formed from silane gas in the low pressure chemical vapor deposition (LPCVD) process followed by proper annealing. A preferred process for such deposition is described in the article by H. Guckel, et al. "Advances in Processing Techniques for Silicon Micromechanical Devices with Smooth Surfaces," Proceedings IEEE Microelectromechanical Systems, Salt Lake City, Utah, Feb. 20-22, 1989, pp. 71-75, and in U.S. Pat. No. 4,897,360, issued Jan. 30, 1989, entitled "Polysilicon Thin Film Process", the disclosures of both of which are incorporated herein by reference. Such polysilicon films are preferably grown in an LPCVD reactor at about 591° C. from 100% silane at 300 milliTorr (mT) reactor pressure. A growth rate of 68Å per minute is typical. The as-deposited films involve two phases when a total film thickness of 2 microns is used. The first phase, which is located between the substrate and the film interior, exhibits polycrystalline behavior with 300Å to 3000Å grain sizes and no measureable orientation. This phase is followed by an amorphous region which starts inside the film and extends to the film surface. The as-deposited films on 3 inch wafers are essentially defect free if the wafer edge is excluded. The measured surface roughness is typically that of the substrate and values as low as 8Å rms have been achieved. The strain fields as measured by the buckled beam technique are compressive at 0.6%. These strains can be converted to predetermined tensile strain levels by nitrogen annealing. During these anneal cycles the amorphous phase changes to the crystalline phase and apparently involves a volume contraction. A nitrogen anneal for one hour at 835° C. produces a final tensile strain of 0.25% without any measurable increase in surface roughness. The same invariance in surface roughness is observed with respect to 24 hour soaks of the material in VLSI grade 49% HF. This polysilicon material thus meets an important requirement for a doubly-clamped beam resonator during device formation, that is, it is in tension. The alternative, a compressive film or beam, would severely limit device dimensions and produce many difficulties during vacuum envelope construction since such structures would tend to buckle as they are freed from the surrounding sacrificial layer. The known high tensile strength of polycrystalline silicon film is an additional benefit. Even though the film is polycrystalline, such resonant beam structures have exhibited high intrinsic mechanical Q, above 65,000, when operated in a vacuum, without detectable resonant frequency shifts due to fatigue.

The level of built-in strain, which can be controlled by controlling the annealing temperature and conditions, helps to determine (and thereby allows selection of) the nominal resonant frequency of the beam with no external forces applied to the beam. A relatively high resonant frequency (above 100 or 200 KHz) is generally preferred to minimize the likelihood that the range of frequencies over which the beam resonates (as force is applied to it) will excite resonances in the surrounding support structure. For example, for one polysilicon beam formed in accordance with the present invention having a 2 micron thickness, 45 micron width and 200 micron length, the resonant frequency with no force applied for zero built-in strain was 433 KHz and for 0.036% tensile built-in strain was 645 KHz. Such strain levels can be selected for the beam by carrying out the processing steps described in the aforesaid U.S. Pat. No. 4,897,360.

In conventional polysilicon processing, the construction of beams from polysilicon with smooth surfaces using thermal silicon dioxide as a sacrificial layer encounters a fundamental problem. HF etches leave a residue, and if two freshly etched surfaces contact each other, very strong adhesion results, especially if the mating surfaces are smooth. Since a long beam is not very stiff, surface tension forces during drying after HF rinses easily cause beam deflections which establish contact between the beam and the substrate. An obvious way of attempting to eliminate the problem is chemical removal of the residue. However, attempts to do so have not given consistent results. An alternative approach avoids contact and produces a dry beam with active surfaces which can then be passivated in gaseous environments or by a conformal coating. Such a method can be implemented if the source of the deflection, surface tension, can be eliminated.

Thus, in the present invention, a three step process is preferably utilized in which all the surfaces within the cavity are at first fully covered by the rinse liquid after the etch. At this point there are no exposed device surfaces and therefore no surface tension forces. The next step is controlled freezing of the rinse fluid. This essentially eliminates deflection from surface tension forces but can produce other difficulties. The frozen liquid should be soft so that it does not destroy the microstructures, as the volume expansion from the liquid phase to the solid phase which occurs for water rinses is very undesirable. The freezing procedure is followed by the sublimation of the solidified rinse liquid. This is preferably accomplished in a vacuum system at temperature and pressure conditions which are set by the triple point of the rinse substance. Temperature changes in the solid must be avoided because they produce expansion effects which are not desirable. After complete sublimation, the temperature of the sample is raised to room temperature. The free-standing, but chemically active structure, is then passivated. For example, an LPCVD deposition of a thin silicon nitride film gives satisfactory passivation, or the surfaces can be passivated with thermal oxidation to form a silicon dioxide layer. This technique for removing the rinse liquid is further described in the Guckel, et al. article above entitled "Advances in Processing Techniques for Silicon Micromechanical Devices with Smooth Surfaces", which is incorporated herein by reference, and in U.S. patent application Ser. No. 07/331,466 by the present applicants now U.S. Pat. No. 5,013,693, entitled "Formation of Microstructures with Removal of Liquid by Freezing and Sublimation", the disclosure of which is incorporated herein by reference.

To achieve a vacuum enclosed, polysilicon beam resonator requires that a suitable shell be formed around the beam to define a cavity which can be evacuated. The material selected for the outer shell is dictated in large part by the desired thermal stability of the finished device. Thus, for a silicon beam resonator formed on a silicon substrate, the shell should be made from silicon. Such shells may be formed by the reactive sealing technique described in U.S. Pat. No. 4,744,863 and 4,853,669 by Guckel, et al., the disclosures of which are incorporated herein by reference. In the reactive sealing technique, the etched channels which are used to introduce the etchant, e.g., HF, into the cavity interior to remove the sacrificial material are kept relatively small. The immersion of a completely etched unsealed structure into an atmospheric pressure oxygen ambient causes etched channel closure because one volume of silicon produces roughly two volumes of silicon dioxide. This closure occurs before the cavity dimensions are significantly affected. The supply of oxygen to the cavity interior is now interrupted, and a vacuum or very low pressure results because the oxygen inside the cavity is consumed as it continues to react with the silicon. An LPCVD deposition of polysilicon or silicon nitride can also be used to close and seal the channels.

Figure 5:
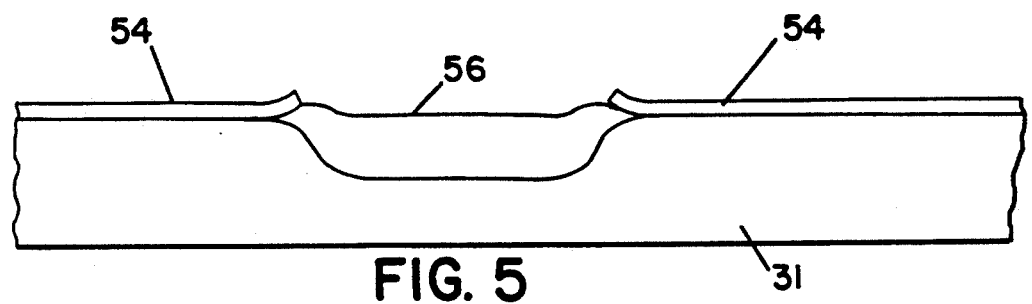

A preferred process for forming the resonating beam transducer 30 is illustrated with reference to FIGS. 3–14. The process is initiated by the formation of a thin silicon dioxide layer on the substrate 31 followed by the deposition of a thin silicon nitride layer over the oxide layer, which is then patterned to leave an opening 53 in the double layer 54 of silicon nitride and silicon dioxide. For example, the silicon nitride layer may be 1100Å in thickness and the underlying silicon dioxide layer may be 300Å. This deposition is followed by the growth of a silicon dioxide layer 55 in the open area 53 to define an oxide well. As an example, the oxide well may be a little over 1 micron in thickness. The oxide well is then removed by applying a silicon dioxide etchant and a second planarized well oxide 56 is grown as shown in FIG. 5, wherein the top surface of the well oxide 56 is substantially at the same level as the surface of the layer 54.

Figure 6:
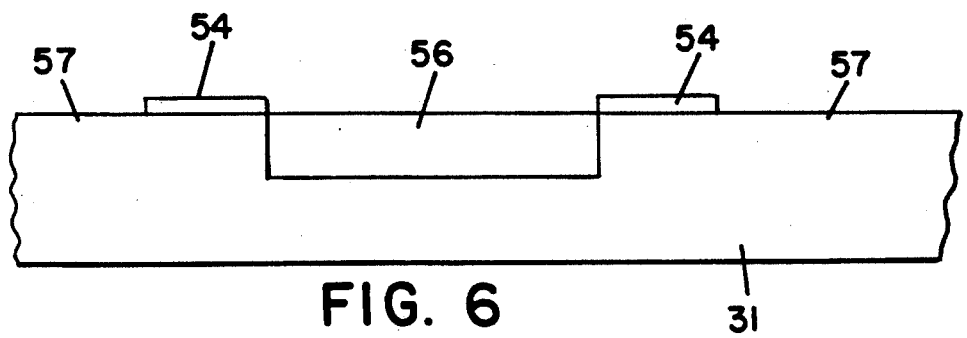

As illustrated in FIG. 6, the silicon nitride/silicon dioxide layer 54 is then patterned to remove the layer in peripheral areas 57 and the silicon nitride/silicon dioxide layer is also patterned so that it is in the form of ridges which extend from the peripheral areas 57 to the area of the well 56, in the manner further described in the aforementioned U.S. Pat. Nos. 4,744,863 and 4,853,669.

As shown in FIG. 7, a layer 59 of polysilicon, which includes the portion of the polysilicon that will form the beam 34, is then deposited. Resistor and capacitor electrodes 44 and 43 are implanted in the beam, an anneal cycle selected to provide the desired strain level is performed, and the beam area 34 is then patterned. As shown in FIG. 8, the polysilicon layer 59 is then patterned and etched to leave the beam 34 separated by an open area 60 from the remaining portions of the polysilicon layer. Openings 61 are also formed in the polysilicon that extend down to the thin nitride/oxide layer 54. The anneal cycle for the polysilicon is performed before the next film is deposited so that the polysilicon film is stable during the next deposition.

Figure 11:
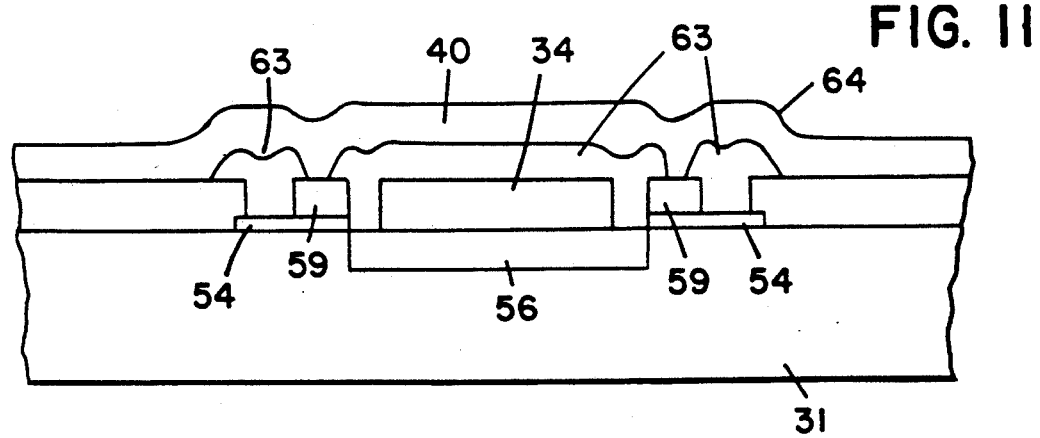
Figure 12:
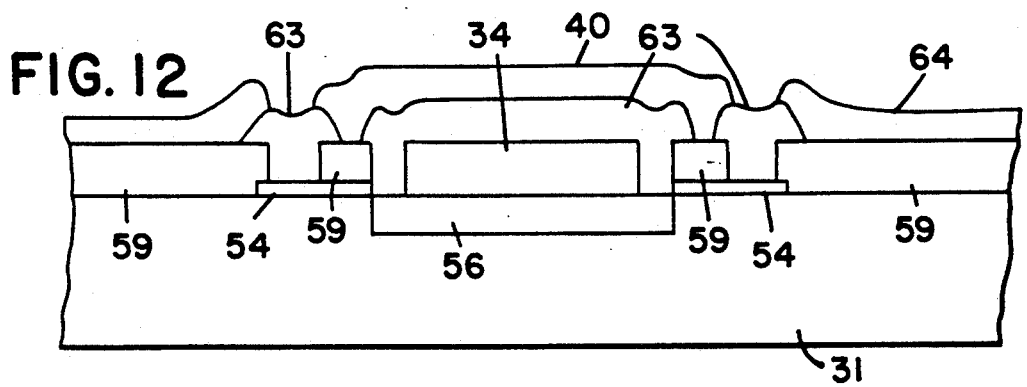
Figure 13:
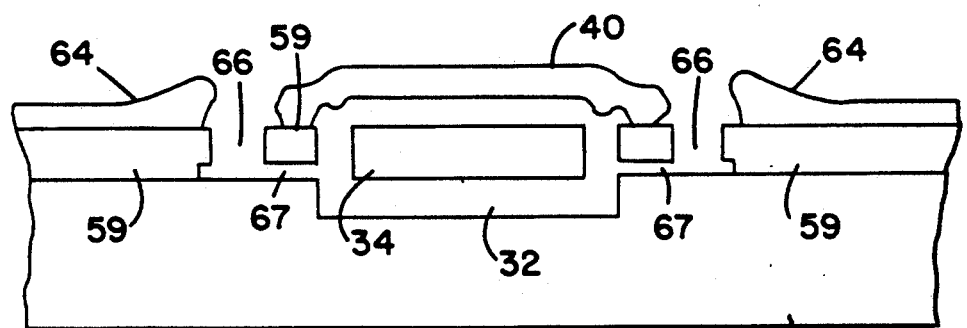

As shown in FIG. 9, a second sacrificial layer 63 (for example, of silicon dioxide or silicon nitride) is then deposited and, as shown FIG. 10, the layer 63 is then patterned and etched. A second polysilicon covering layer 64 is then deposited, as shown in FIG. 11, which includes the shell 40 which will eventually enclose the resonating beam. As shown in FIG. 12, the covering polysilicon is then patterned and etched to expose the sections 63 of free-standing silicon nitride. The structure is then etched in hydrofluoric acid (HF) to remove the sacrificial layers and free the beam, resulting in the beam being surrounded by an open cavity 32 with wells 66 leading into channels 67 which are in communication with the cavity 32. The channels 67 are etched out from the areas occupied by the nitride/oxide sacrifical layer 54. The HF etch is followed by the freeze-sublimation procedure described above to leave the beam 34 undeflected and out of bonding contact with the adjacent walls of either the shell 40 or the substrate 31.

Figure 14:
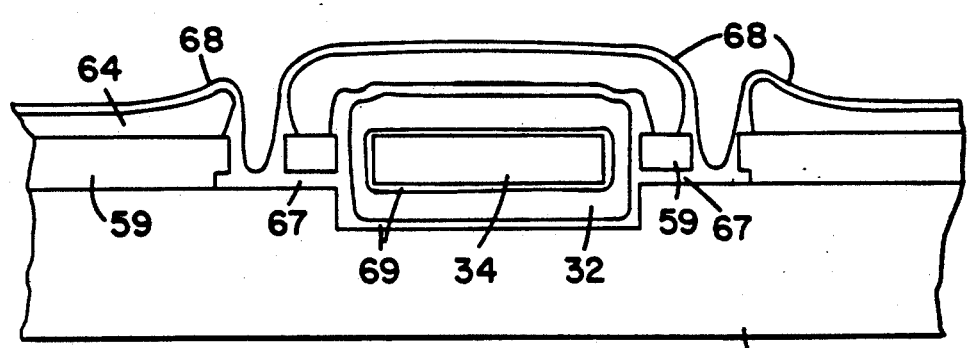

As shown in FIG. 14, the structure is then passivated and partially sealed by immersion in an oxidizing ambient to form an oxide layer 69 on the interior of the cavity 32 and an oxide layer 68 (e.g., 120Å thick) on the outside and in the channels 67 to partially close these channels. Following the oxidation, the entire structure and the layer 68 has LPCVD silicon nitride deposited thereon, e.g., to depth of 2100A, which completes the sealing of the channels leading to the cavity. Once the channels 67 are sealed, the residual gases within the cavity 32 continue to react inside the cavity, both on the surfaces of the beam 34 and on the interior surfaces of the polysilicon shell 40 and the crystalline substrate 31, until the residual gases within the cavity are substantially consumed. Any gas for the LPCVD deposit of silicon nitride which remains in the cavity will also continue to react until it is consumed. This leaves essentially a vacuum in the cavity, although a certain percentage of inert gas can be mixed in with the oxidizing ambient to control the pressure within the cavity 32 to a desired level if desired. Because of the very small dimensions of the interior of the cavity 32, the actual pressure inside the cavity is difficult to measure quantitatively. The effective equivalent pressure inside the cavity when evacuated by reactive sealing as described above can be estimated by comparing the measured Q of a beam inside the cavity with the measured Q of an equivalent open beam inside a vacuum chamber as the vacuum chamber is pumped down. The pressure inside the cavity is estimated at $10^{-9}$ mmHg in this way. However, it may be noted that the typical dimensions inside the cavity are on the order of the mean free path of an oxygen molecule, so that classical gas laws are not necessarily applicable.

The foregoing steps are followed by patterning and cutting of the silicon nitride layer 68 to provide contacts with the diffused conductive electrodes 43 and 44, and metal is then deposited on the surface in contact with these electrodes and patterned as shown in FIG. 2.

Figure 15:
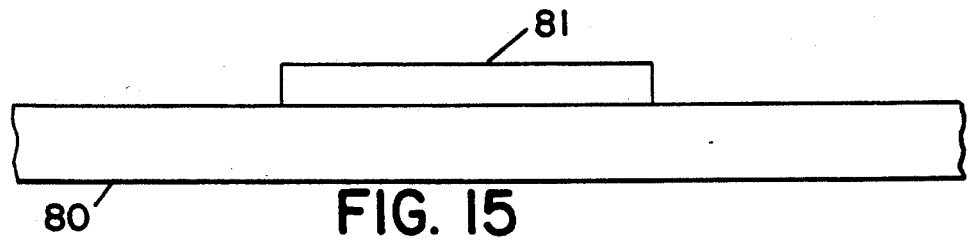
FIGS. 15-21 are cross-sectional views through a substrate illustrating the sequential processing steps in the formation of another version of a resonating beam force transducer in accordance with the present invention.
Figure 16:
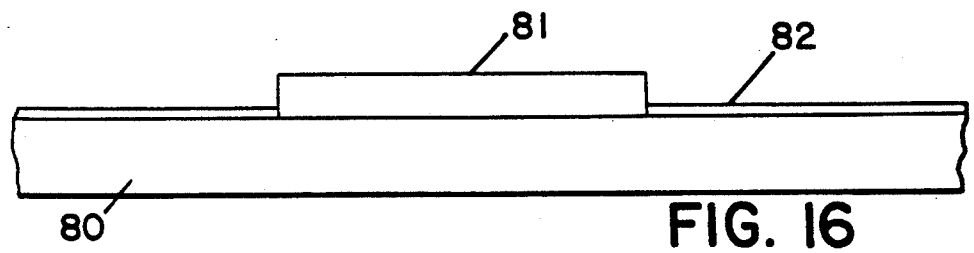
Figure 17:
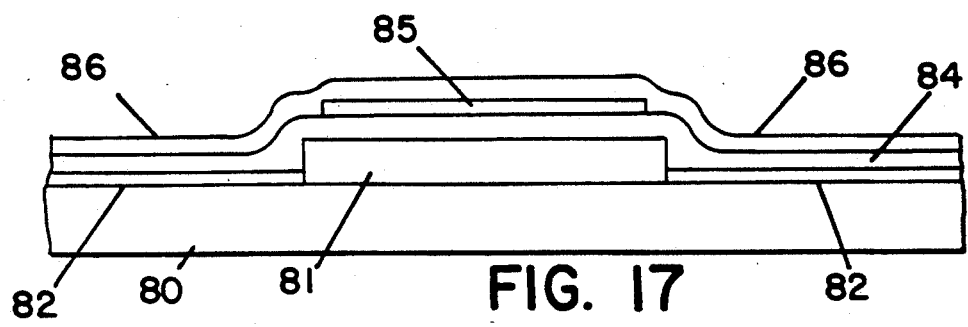
Figure 18:
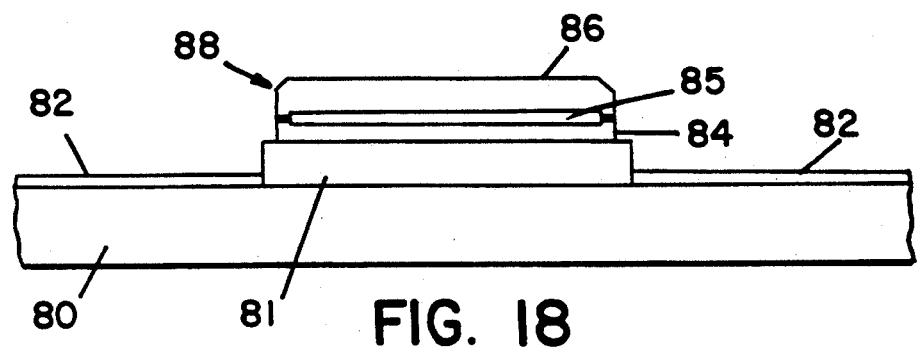

An alternative process for producing a resonant beam transducer of the present invention is illustrated in the views of FIGS. 15-21. With reference to FIG. 15, a substrate 80, such as single crystal silicon, has an oxide post sacrificial layer 81 formed thereon, utilizing the usual masking and oxidation procedures. As shown in FIG. 16, an oxide layer 82 is then formed over the surface of the substrate in the areas outside the post 81. Subsequent depositions, shown in FIG. 17, include a first layer 84 of polysilicon, an intermediate silicon nitride layer 85 formed in the area over the post 81, and a top layer of polysilicon 86. Each polysilicon layer is annealed at proper temperatures (the highest temperature of subsequent depositions) before additional layers are deposited (e.g., at the 835° C. temperature of the silicon nitride deposition). The polysilicon layers 84 and 86 are then masked and etched away in the areas outside of the post 81 to leave an isolated beam structure 88, as shown in FIG. 18. It is understood that the view of FIG. 18 is a cross section through the width of the beam at a position intermediate its ends. The purpose of the silicon nitride isolation layer 85 is to electrically isolate the conductive resistors implanted in the top surface of the outer layer 86 from the inner polysilicon layer 84. Conductive electrodes for forming the capacitor plate and the piezoresistive sensing resistor can be formed in the top surface of the outer layer 86 of the beam by ion implantation.

Figure 19:
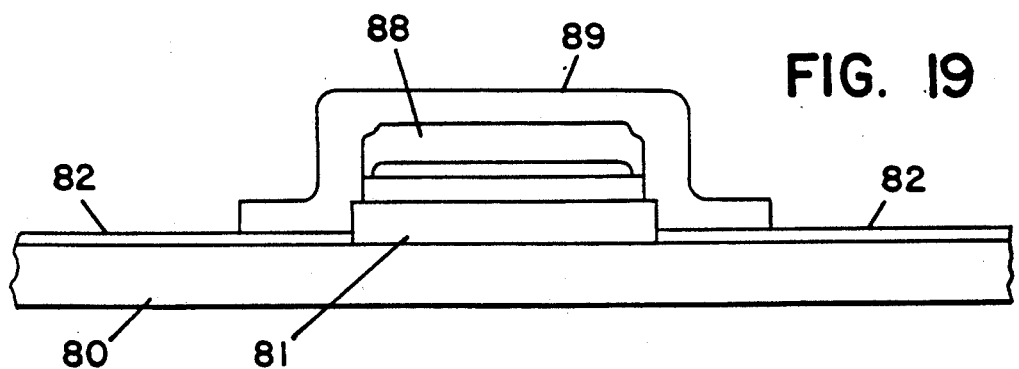
Figure 20:
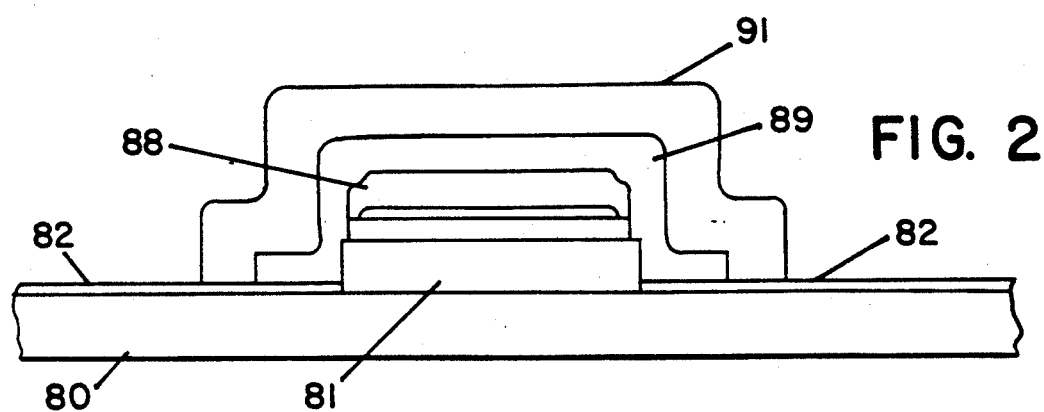
Figure 21:
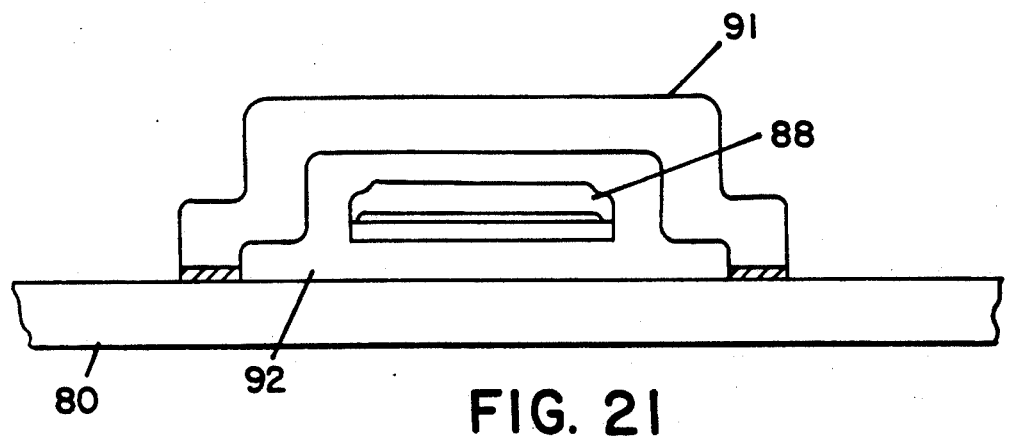

After the beam 88 has been isolated and the conductors are formed in it, an outer sacrificial layer 89 of silicon nitride is deposited and etched to define the outer boundaries of the desired cavity, as illustrated in FIG. 19. Oxidized polysilicon can be used to define the etch mask for silicon nitride etched in boiling phosphoric acid. The outer or shell layer of polysilicon 91 is then deposited over the sacrificial layer 89, as illustrated in FIG. 20, and the steps of etching out the sacrificial oxide and nitride layers 81, 82 and 89 is carried out as described above to leave the isolated beam 88 sealed within the cavity 92, as illustrated in FIG. 21. Reactive sealing of the channels (left under the polysilicon shell 91 by etching away the silicon oxide layer 82) is carried out by the reactive sealing technique discussed above.

Figure 22:
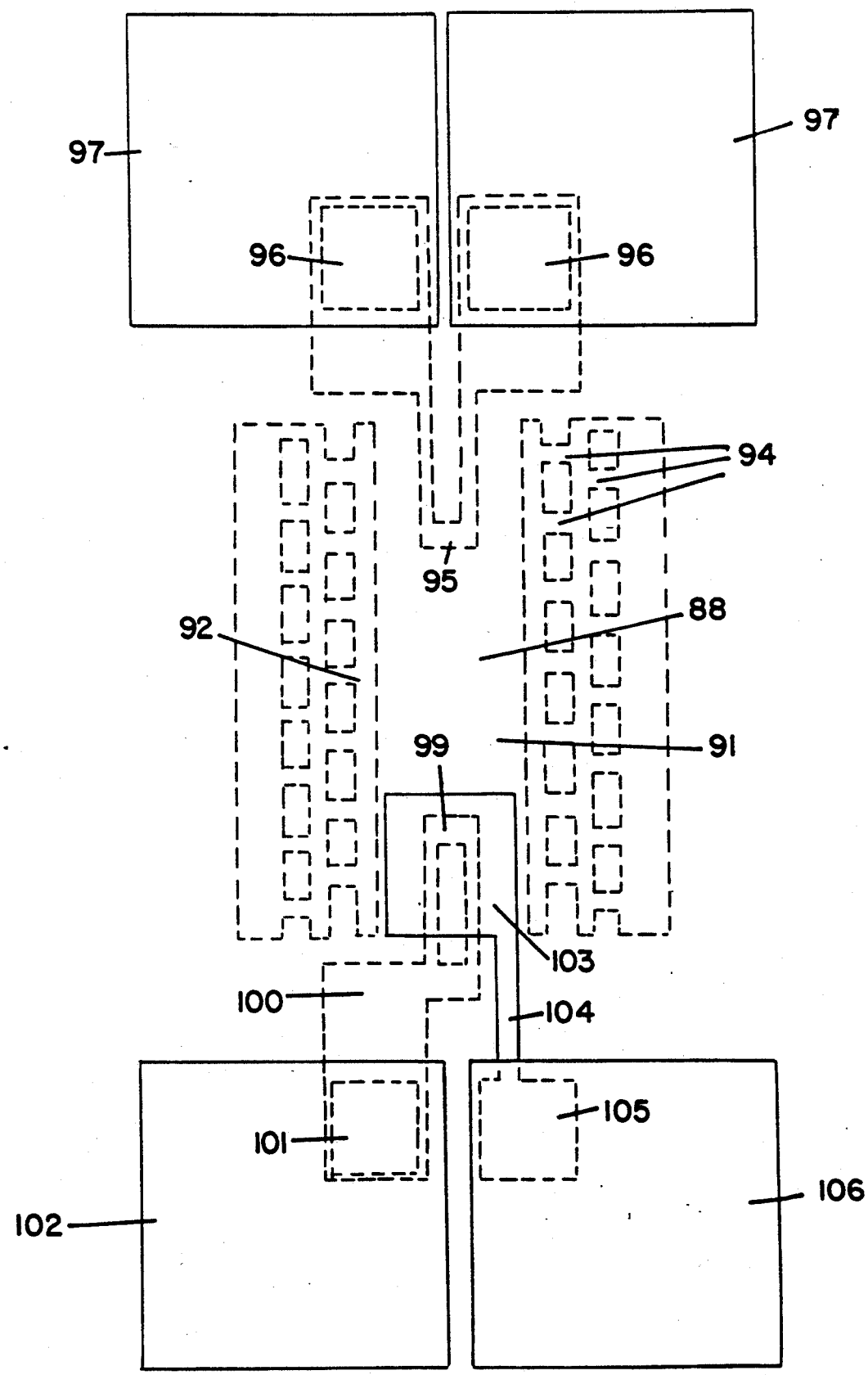
FIG. 22 is a plan view of a resonating beam force transducer formed utilizing the processing steps illustrated in FIGS. 15-21.

A top view of a transducer formed in accordance with the steps described above is shown in somewhat simplified form in FIG. 22. The resonating beam 88 is shown in dashed lines in FIG. 22, as it is covered by the polysilicon shell 91. On one end of the beam 88 a piezoresistor electrode 95 is formed by ion implantation as described above, with the implantation extending outwardly beyond the beam to contact areas 96 which are overlayed with metal pads 97 to provide attachment points for external wires. The position of the resistor 95 is shown in dashed lines in FIG. 21 as it is covered and hidden by the outer polysilicon shell 91. Ridges 94 are formed adjacent to the sides of the cavity 92 and define the channels left by etching of the sacrificial layer 82 by which the etchant reached the sacrificial layers 81 and 89 which surrounded the beam 88. These channels are filled with oxide and silicon nitride as reactive sealing of the cavity 92 takes place.

A capacitive electrode 99 is formed on the other end of the beam 88 by ion implantation of a dopant, such as boron, with the doping extending outside of the beam area in a conductive layer 100 which extends to a contact pad 101. A metalized contact pad 102 is deposited over and is in electrical contact with the doped layer 100 at the area 101. As the conductive electrode 99 formed in the beam is hidden by the polysilicon shell 91 in FIG. 22, it is shown in dashed lines. A conductive layer 103 is formed by ion implantation on the top of the polysilicon shell 91 above the position of the electrode 99 on the beam 88 to provide the other plate of the capacitor which is used to drive oscillations in the beam 88. A conducting path 104 is formed by ion implantation of a dopant from the plate 103 to a contact area 105, over which is deposited a metal pad 106 to which connections to external circuitry can be made. By applying an oscillating voltage between the pads 102 and 106 at or near the resonant frequency of the beam, the beam can be driven into resonant oscillation. By applying a voltage to the output pads 97, the current flowing through the piezoresistor 95 can be measured by external circuitry (not shown) and this current will vary as a function of the oscillations in the beam due to the piezoresistive change in the resistance of the electrode 95 as the beam is strained during vibrational deflections.

The resonant beam transducer as shown in FIG. 22 may have similar dimensions to the transducer of FIG. 2, and will demonstrate similar resonant behavior and shifts of resonance with applied strain.

Figure 23:
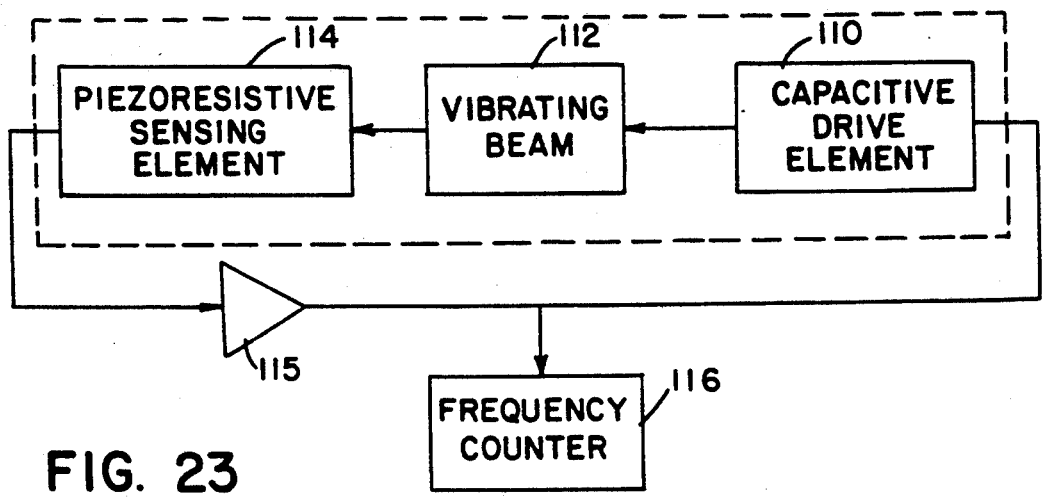
FIG. 23 is a schematic block diagram of a self-sustained oscillator circuit incorporating the resonating beam of the invention.

An exemplary feed back circuit for exciting and measuring vibrations in the beam transducers is shown in FIG. 23. An electrical signal applied to the capacitive drive element 110 of FIG. 23 (i.e., the plate 42 or the plate 103) drives mechanical oscillations in the beam 112 which are detected and converted to an electrical signal by the piezoresistive element 114. This electrical signal is amplified by an amplifier 115 and fed back to the drive element 110 to sustain self oscillation, which is measured by a frequency counter 116.

Although a preferred transducer is formed on a single crystal silicon substrate, the transducer may also be formed substantially as described above on other substrates, such as quartz or sapphire.

The transducer of the present invention may be built utilizing other beam structures, such as an H beam structure in which two doubly-clamped beams are connected by a lateral cross member. For such a structure, the excitational electrode may be formed on one of the beams and the piezoresistive electrode used for measuring oscillations may be formed on the other beam. The beam may also be formed as a hollow tube which is open at its ends to the ambient atmosphere. Such a structure may be formed to allow reactions to occur on its surfaces which affect the resonant frequency of the beam, thereby detecting the presence of a selected gas.

The transducer structure of FIG. 24 is essentially similar to the structure of FIG. 1 except that its beam 120 is free at one end to form a cantilever beam. The cantilever beam 120 may be excited by using an electrode 121 formed by doping the polysilicon of the beam in a pattern which extends out from the beam on the same side as the piezoresistive electrode 44. The structure may be formed using the same processing procedures described above for the doubly-clamped beam. The cantilever beam transducer can be used for various purposes, for example, as an oscillator tuning fork element or as an accelerometer.

The means by which excitation and detection of beam vibration is accomplished may take various forms. For example, a PN junction may be formed on the polysilicon beam which may be sensitive to strain in the beam. The junction may be formed to be photosensitive, allowing the vibration in the beam to be excited by directing light having an oscillating intensity at the junction. Silicon is transparent to deep red or infrared light, and such light may be projected through the polysilicon shell at the beam. The light may be directed to the shell from a remote source through a fiber optic cable. The vibrations of the beam may also be detected by projecting light from an input cable onto the beam and receiving light reflected from the surface of the beam (with a relective coating thereon, if desired) by an output cable, thereby allowing non-electrical sensing of beam vibrations.

Figure 25:
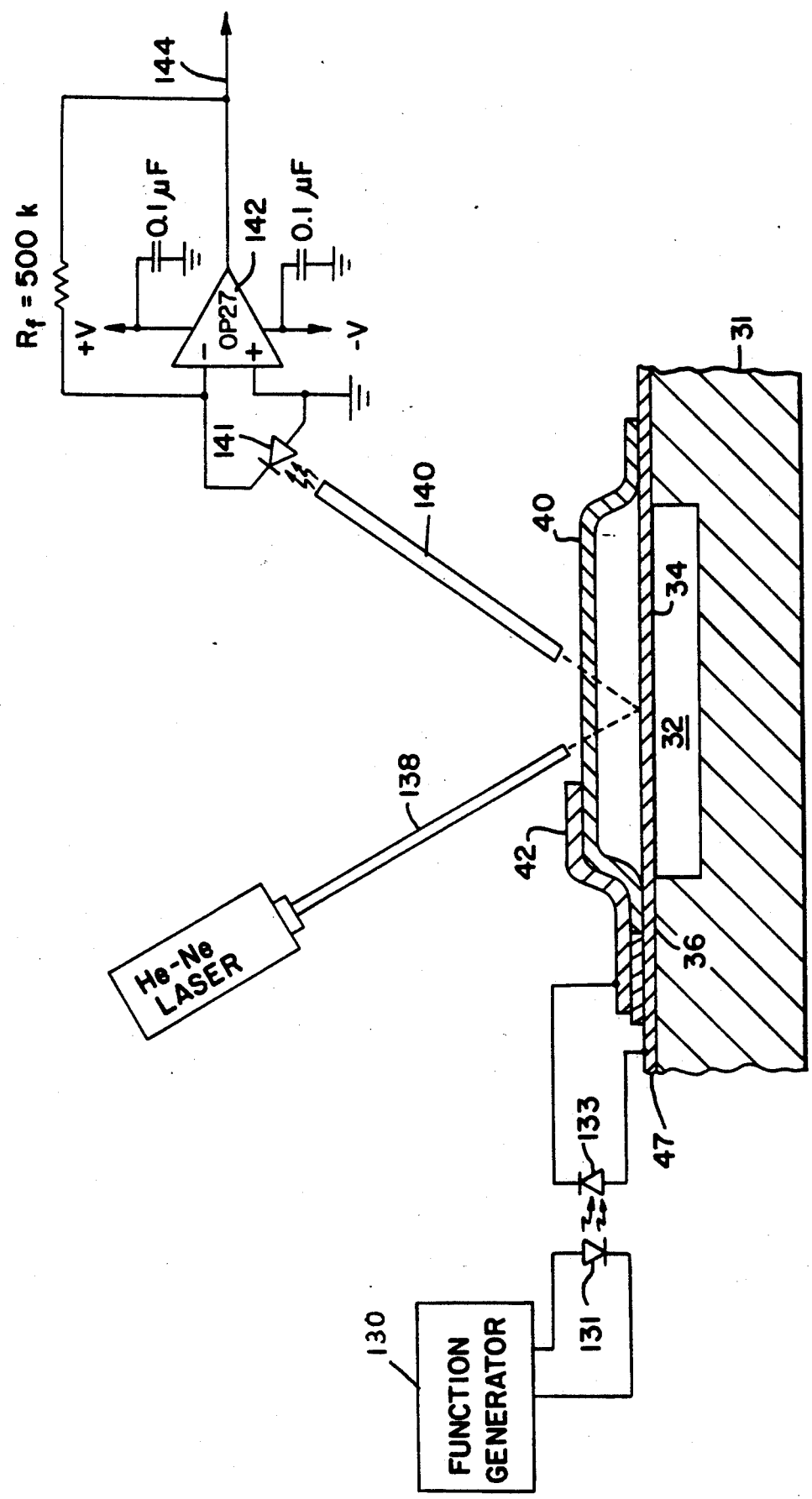
FIG. 25 is a cross-sectional and schematic view of a resonating beam transducer which utilizes optical detection of the vibration of the beam.

FIG. 25 shows the transducer of the present invention arranged for isolated optical excitation of the beam and direct optical detection of beam vibrations. The basic transducer structure is, for example, substantially the same as the transducer 30 of FIG. 1. The electrical signal to drive the capacitive excitation of the beam can be provided using a photovoltaic voltage in response to light from a light source modulated at the resonant frequency. As shown in FIG. 25, a function generator 130 (e.g., Hewlitt Packard FG 5010) is connected to drive an LED 131 at the resonant frequency of the beam 34. An external photodiode 133 receives the light from the LED and is electrically connected to the plate electrode 42 and to the pad 47 which connects to the electrode formed on the beam. Alternatively, a photodiode may be fabricated on the silicon substrate next to the resonating beam structure.

As shown in FIG. 25, the excitation light may be provided from a laser 136 yielding a monochromatic light output (e.g., Spectra Physics 155 Helium/Neon laser, 0.95 mW, 6328.5 Å wavelength), which is directed to the shell 40 of the transducer by an optical fiber cable 138. The light from the optical fiber cable 138 is projected through the shell 40 to the beam 34 and is reflected therefrom back through the shell where it is received by another fiber optic cable 140 and directed to a remote position. At the remote position, the light is detected by a photodetector 141 connected to an operational amplifier 142 which delivers an electrical output on a line 144 which is indicative of the vibrations of the beam.

In the transducers of the present invention, the gaps between the beam and the surrounding structure (the shell and substrate) are very small, for example, in the range of 2 microns or less and preferably 1 micron (10,000 Å). This distance is comparable to the wavelength of commonly used lasers (e.g., 6330 Å for helium/neon), resulting in interference patterns as the beam vibrates which can be detected to determine the vibrations of the beam.

The arrangement of FIG. 25 thus provides a resonating force transducer with optically isolated excitation and sensing, which also eliminates the need for metal interconnections. This structure is thus well suited for high temperature (e.g., above 180° C.) applications. Optical isolation also eliminates feed through from the excitation to the sense circuitry, allowing the detection circuitry to be simpler.

It is understood that the invention is not confined to the particular embodiments set forth herein as illustrative, but embraces such modified forms thereof as come within the scope of the following claims.

What is claimed is:

1. A method of making a resonant beam force transducer comprising the steps of:
   (a) forming a beam of polysilicon mounted at its ends above a substrate;
   (b) annealing the polysilicon beam so it has zero or low built-in tensile strain;
   (c) encapsulating the beam in a polysilicon shell which forms with the substrate a cavity which surrounds the beam, and channels formed in the shell leading from the cavity;
   (d) sealing the interior of the cavity from the external atmosphere with a gas which reacts to deposit solid material in the channels to close them and to evacuate the cavity.

2. The method of claim 1 wherein the step of encapsulating the beam in a polysilicon shell involves the further steps of forming a sacrificial layer under the beam and a sacrificial layer over and surrounding the beam, depositing the polysilicon shell over the sacrificial layer surrounding the beam with channels extending through the periphery of the polysilicon layer, applying an etchant to the substrate and the deposited polysilicon layer thereon which etches through the channels in the polysilicon and etches out the sacrificial layers around the beam to expose the beam, removing the etchant and exposing the substrate and polysilicon layer thereon to an oxidizing gas including oxygen for a period of time sufficient to form an oxide of the polysilicon layer in the channels which at least partially closes the channels.

3. The method of claim 2 wherein after the step of applying an etchant to etch the sacrificial layers, the polysilicon beam and the polysilicon shell are maintained in a freezeable liquid so that these structures are not dried out after the sacrificial layers have been removed, then freezing the liquid and sublimating the frozen liquid from the cavity before carrying out the further steps of exposing the substrate and the polysilicon layer to an oxidizing gas.

4. The method of claim 1 wherein the step of forming the polysilicon shell comprises the step of depositing polysilicon by chemical vapor deposition.

5. The method of claim 1 wherein the step of forming the polysilicon beam comprises the steps of depositing polysilicon onto an initially formed sacrificial layer by chemical vapor deposition of polysilicon from a gas, removing the sacrificial layer to leave the free beam mounted at its ends to the substrate, and subsequently annealing the beam at a temperature to provide a low tensile or zero strain within the beam.

6. The method of claim 1 including the further steps of implanting dopants in patterns onto the polysilicon beam to provide conductive paths therein for forming a plate of a capacitor for exciting vibrations of the beam and for providing a piezoresistive conducting path in the beam to allow the vibratory motions of the beam to be detected.

* * * * *